(12) United States Patent
Li et al.

(10) Patent No.: US 11,831,124 B1
(45) Date of Patent: Nov. 28, 2023

(54) ELECTRO-ABSORPTION MODULATED LASER CHIP AND FABRICATION METHOD THEREOF

(71) Applicant: Yuanjie Semiconductor Technology Co., Ltd., Xi'an (CN)

(72) Inventors: Mahui Li, Xi'an (CN); Yenting Pan, Xi'an (CN); Yao Mu, Xi'an (CN); Yuchen Shi, Xi'an (CN); Haichao Zhang, Xi'an (CN)

(73) Assignee: Yuanjie Semiconductor Technology Co., Ltd., Xi'an (CN)

( * ) Notice: Subject to any disclaimer, the term of this patent is extended or adjusted under 35 U.S.C. 154(b) by 0 days.

(21) Appl. No.: 18/190,318

(22) Filed: Mar. 27, 2023

Related U.S. Application Data

(63) Continuation of application No. PCT/CN2022/092704, filed on May 13, 2022.

(30) Foreign Application Priority Data

May 9, 2022 (CN) .......................... 202210498033.8

(51) Int. Cl.
  *H01S 5/00* (2006.01)
  *H01S 5/026* (2006.01)
  *H01S 5/50* (2006.01)

(52) U.S. Cl.
  CPC .......... *H01S 5/0064* (2013.01); *H01S 5/0085* (2013.01); *H01S 5/0265* (2013.01); *H01S 5/50* (2013.01)

(58) Field of Classification Search
  CPC ... H01S 5/06821; H01S 5/0656; H01S 5/0064
  (Continued)

(56) References Cited

U.S. PATENT DOCUMENTS

2005/0063636 A1* 3/2005 Joyner ................ H04J 14/0265
  385/14
2005/0249509 A1* 11/2005 Nagarajan ................ H01S 5/12
  398/198

(Continued)

FOREIGN PATENT DOCUMENTS

CN  109256675 A  1/2019
CN  209233159 U  8/2019

*Primary Examiner* — Tuan N Nguyen
(74) *Attorney, Agent, or Firm* — Nitin Kaushik

(57) ABSTRACT

The disclosure belongs to the technical field of photoelectric emission in semiconductors, and discloses an electro-absorption modulated laser chip and a fabrication method thereof, which can solve the problems of signal distortion caused by optical crosstalk between components in an existing electro-absorption modulated laser (EML) integrated with a semiconductor optical amplifier (SOA), and failure in longer-distance transmission. The laser chip includes: a laser light source; an electro-absorption modulator disposed on a light-emitting side of the laser light source; a semiconductor optical amplifier disposed on a light-emitting side of the electro-absorption modulator; and at least one isolation assembly disposed between the laser light source and the electro-absorption modulator, and/or, disposed between the electro-absorption modulator and the semiconductor optical amplifier, and configured to isolate optical crosstalk among the laser light source, the electro-absorption modulator, and the semiconductor optical amplifier. The disclosure is used for the electro-absorption modulated laser chip.

13 Claims, 11 Drawing Sheets

(58) Field of Classification Search
USPC .......................................................... 372/20
See application file for complete search history.

(56) References Cited

U.S. PATENT DOCUMENTS

2007/0242919 A1* 10/2007 Welch ................ G02B 6/12021
  385/14
2014/0198816 A1* 7/2014 Margalit ................... H01S 5/22
  372/45.01

* cited by examiner

ELECTRO-ABSORPTION MODULATED LASER CHIP AND FABRICATION METHOD THEREOF

CROSS-REFERENCE TO RELATED APPLICATIONS

The application claims priority to Chinese patent application No. 2022104980338, filed on May 9, 2022, the entire contents of which are incorporated herein by reference.

TECHNICAL FIELD

The disclosure relates to an electro-absorption modulated laser chip and a fabrication method thereof, and belongs to the technical field of photoelectric emission in semiconductors.

BACKGROUND

With the continuous development of information age, people put forward higher requirements for the capacity and quality of data traffic transmission. Under the promotion of massive requirements, the optical communication technology is constantly upgraded. As core components of the optical communication technology, high-rate optical devices are also constantly developing along with such technological development. Electro-absorption modulated laser (EML) chips have the advantages of high modulation rate and low frequency chirp effect compared to directly modulated lasers (DMLs), thus being promising in high-rate modulation and long-distance transmission application.

In a long-distance transmission passive optical network (PON) access network, laser light sources are required to have higher output power and lower chirp effect to ensure a larger branch ratio and a longer transmission distance. An EML is an optoelectronic device monolithically integrated by a laser light source and an electro-absorption modulator (EAM). Since the EAM itself is a loss-type modulator, the EAM is modulated in a deeper light absorption state, and light emitted by the laser generates a large amount of absorption in the EAM, so the optical output power of the EML is limited to a lower power level. In PON access network application, the optical output power of the EML directly limits the possibility of further increasing the transmission distance and the branch ratio.

To improve the optical output power of the EML, experts at home and abroad propose a solution of integrating a semiconductor optical amplifier (SOA) at the rear end of the EML, that is, of a three-segment structured laser with a laser light source, an EAM and an SOA, as shown in FIG. 1. However, after the SOA is integrated, optical crosstalk between different segments will be caused. The presence of optical crosstalk will result in degradation of the line width, the side-mode suppression ratio and the relative intensity noise of the laser, and especially during high-rate modulation, the optical crosstalk easily causes the laser to fall into a self-pulse or chaotic working state, and eventually leads to distortion of modulation signals. To solve this problem, researchers attempt to reduce the reflection of light on an end surface by methods, such as inclination of the light-emitting end surface, a passive window in the light-emitting end surface, and a highly anti-reflective coating. However, these methods cannot completely solve the problem of optical crosstalk in practical application.

SUMMARY

The disclosure provides an electro-absorption modulated laser chip and a fabrication method thereof, which can solve the problems of signal distortion caused by optical crosstalk between components in an existing electro-absorption modulated laser (EML) integrated with a semiconductor optical amplifier (SOA), and failure in longer-distance transmission.

According to one aspect, the disclosure provides an electro-absorption modulated laser chip, including:
 a laser light source;
 an electro-absorption modulator, disposed on a light-emitting side of the laser light source;
 a semiconductor optical amplifier, disposed on a light-emitting side of the electro-absorption modulator; and
 at least one isolation assembly, disposed between the laser light source and the electro-absorption modulator, and/or, disposed between the electro-absorption modulator and the semiconductor optical amplifier, and configured to isolate optical crosstalk among the laser light source, the electro-absorption modulator, and the semiconductor optical amplifier.

Optionally, each of the isolation assemblies includes at least one isolation unit;
 each of the isolation units includes an optical isolation electrode and a corresponding electrical isolation group, and the electrical isolation group includes two strip-shaped insulating components disposed oppositely; and
 the optical isolation electrode is located above an intra-group region of the corresponding electrical isolation group.

Optionally, each of the isolation assemblies includes a plurality of isolation units; and
 the plurality of isolation units are arranged along an optical path direction in the laser chip.

Optionally, the number of the isolation units included in each of the isolation assemblies ranges from 1 to 10.

Optionally, an intra-group interval spacing of the electrical isolation group in each of the isolation units ranges from 30 μm to 100 μm.

Optionally, a width of the optical isolation electrode in the isolation unit ranges from w*10% to w*70%, where w is the inter-group interval spacing of the electrical isolation group corresponding to the optical isolation electrode.

Optionally, a voltage of the optical isolation electrode in the isolation unit ranges from 2 V to −2 V.

Optionally, the laser chip includes a substrate, and a functional layer, an upper cladding layer and an electrode layer, which are stacked on the substrate in sequence;
 the laser light source includes a light source region located in the functional layer and a light source electrode located in the electrode layer;
 the electro-absorption modulator includes a modulator region located in the functional layer and a modulator electrode located in the electrode layer;
 the semiconductor optical amplifier includes an optical amplifier region located in the functional layer and an optical amplifier electrode located in the electrode layer;
 the electrical isolation group of the isolation unit is located in the upper cladding layer; and the optical isolation electrode is located in the electrode layer.

Optionally, a vertical distance from the strip-shaped insulating component on a leftmost side in a light-emitting direction to an interface between the light source region and the modulator region ranges from 0 to n*b, where n is the number of optical isolation electrodes disposed between the laser light source and the electro-absorption modulator, and b is an intra-group interval spacing of the electrical isolation group disposed between the laser light source and the electro-absorption modulator; and a vertical distance from the strip-shaped insulating component on a rightmost side in the light-emitting direction to an interface between the modulator region and the optical amplifier region ranges from 0 to m*d, wherein m is the number of optical isolation electrodes disposed between the electro-absorption modulator and the semiconductor optical amplifier, and d is an intra-group interval spacing of the electrical isolation group disposed between the electro-absorption modulator and the semiconductor optical amplifier.

Optionally, the optical isolation electrodes included in all the isolation assemblies are electrically connected to one another.

Optionally, the optical isolation electrodes included in all the isolation assemblies are electrically connected to the substrate.

Optionally, the upper cladding layer is further provided with an insulating layer; and the insulating layer is disposed in a region, that is not covered by the electrode layer, of the upper cladding layer.

Optionally, the laser chip further includes an anti-reflective coating layer, which is located on a light-emitting end surface of the semiconductor optical amplifier, and a highly reflective coating layer, which is located on an end surface of one side, that is away from the electro-absorption modulator, of the laser light source.

According to another aspect, the disclosure provides a fabrication method for any one of the above electro-absorption modulated laser chips, including:

epitaxially growing a functional layer on a substrate;
growing an upper cladding layer on the functional layer;
fabricating at least one electrical isolation group on the upper cladding layer; and
forming an electrode layer on the upper cladding layer, and forming an N-surface electrode on one side, that is away from the functional layer, of the substrate.

Optionally, the electrical isolation group is fabricated on the upper cladding layer by means of an etching technology or an ion implantation technology.

The disclosure has the following beneficial effects:

According to the electro-absorption modulated laser chip provided by the disclosure, the plurality of isolation assemblies are fabricated in a distributed manner between the laser light source and the electro-absorption modulator (EAM) and between the EAM and the semiconductor optical amplifier (SOA), and during use of the chip, different voltages are applied to the optical isolation electrodes of the isolation assemblies, respectively, to adjust the optical isolation capability of an optical isolation electrode region, so as to implement optical isolation among the SOA, the EAM, and the laser light source, achieve the objective of controlling signal distortion of the electro-absorption modulated laser (EML) integrated with the SOA, and implement longer-distance transmission of a signal; and on this basis, the refractive index change of the region may also be controlled by adjusting the voltage of the optical isolation electrodes, to implement chirp compensation of the laser modulation signal, and achieve the objective of increasing the transmission distance of the laser. The technology of the disclosure is more liable to implement mass production and manufacturing of high-power EMLs, and provides a feasible solution for further expansion of a passive optical network (PON) access network.

Figure 1:
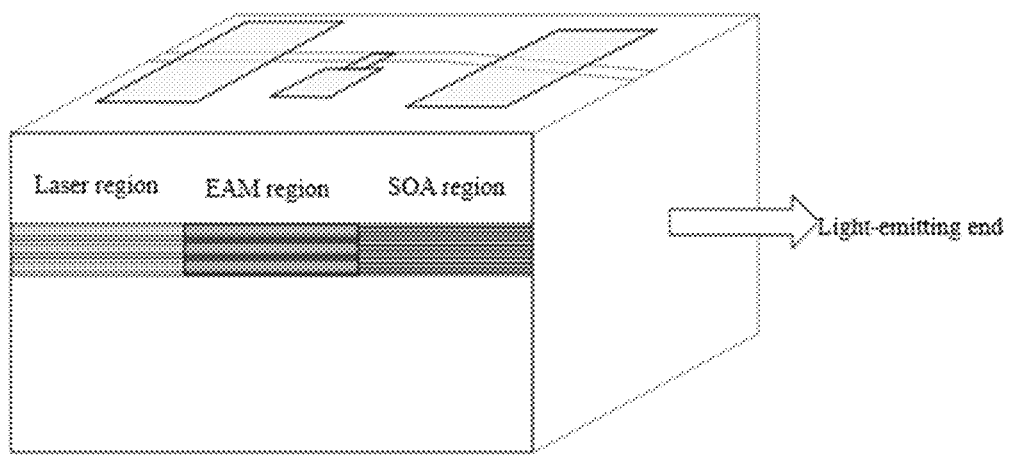
FIG. 1 is a schematic structural diagram of a three-segment electro-absorption modulated laser (EML) integrated with a semiconductor optical amplifier (SOA) provided in the prior art.
Figure 2:
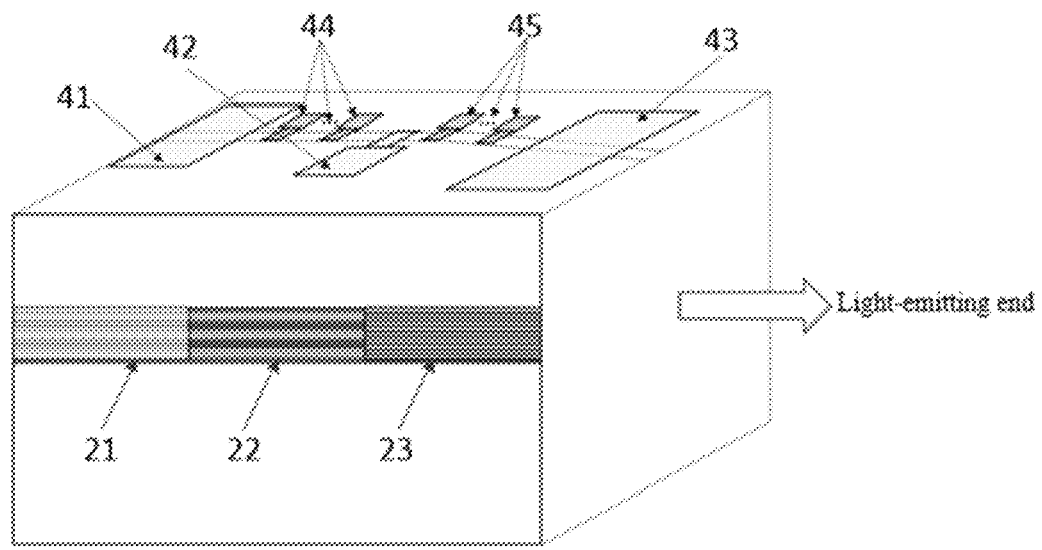
FIG. 2 is a schematic structural diagram of a distributed optical isolation EML integrated with an SOA provided in an embodiment of the disclosure.
Figure 3:
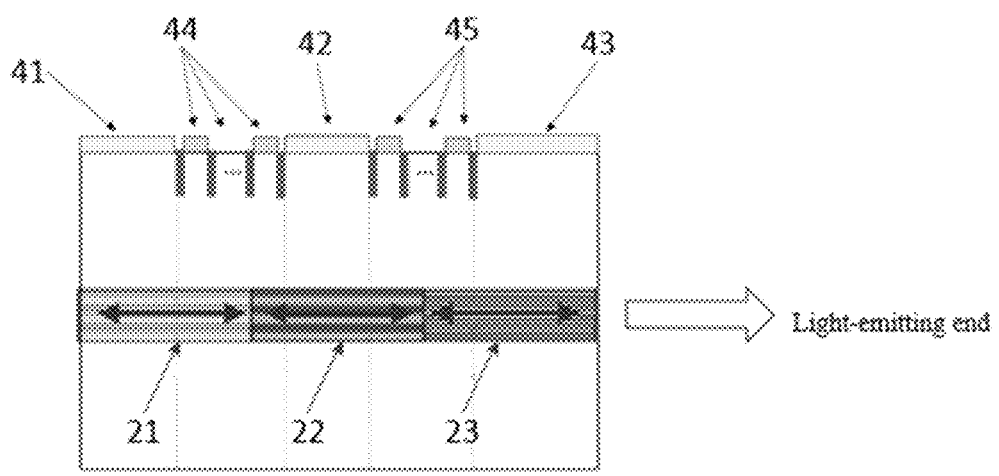
FIG. 3 is a schematic sectional view of an optical waveguide of the distributed optical isolation EML integrated with the SOA provided in the embodiment of the disclosure.

A list of components and reference signs is as follows:

10: substrate; 21: light source region; 22: modulator region; 23: optical amplifier region; 30: upper cladding layer; 31: first electrical isolation group; 32: second electrical isolation group; 41: light source electrode; 42: modulator electrode; 43: optical amplifier electrode; 44: first optical isolation electrode; 45: second optical isolation electrode; 51: anti-reflective coating layer; 52: highly reflective coating layer; and 61: N-surface electrode.

DETAILED DESCRIPTION

The disclosure is described in detail below with reference to the embodiments, but the disclosure is not limited to these embodiments.

An embodiment of the disclosure provides an electro-absorption modulated laser chip. As shown in FIG. 2 to FIG. 11, the electro-absorption modulated laser chip includes: a laser light source; an electro-absorption modulator disposed on a light-emitting side of the laser light source; a semiconductor optical amplifier disposed on a light-emitting side of the electro-absorption modulator; and at least one isolation assembly disposed between the laser light source and the electro-absorption modulator, and/or, disposed between the electro-absorption modulator and the semiconductor optical amplifier, and configured to isolate optical crosstalk among the laser light source, the electro-absorption modulator, and the semiconductor optical amplifier.

Each isolation assembly includes at least one isolation unit; each isolation unit includes an optical isolation electrode and a corresponding electrical isolation group, and the electrical isolation group includes two strip-shaped insulating components disposed oppositely; and the optical isolation electrode is located above an intra-group region of the corresponding electrical isolation group. In practical application, the strip-shaped insulating components may be fabricated by means of an etching technology or an ion implantation technology.

According to the disclosure, a plurality of groups of optical isolation electrodes are fabricated in a distributed manner between the laser light source and the electro-absorption modulator (EAM) and between the EAM and the semiconductor optical amplifier (SOA), so that the problem of signal distortion caused by optical crosstalk between components in the EML integrated with the SOA can be effectively prevented, and longer-distance transmission of a signal is implemented; and meanwhile, the design may also compensate chirp of the optical signal of the laser and further increase the transmission distance.

In another embodiment of the disclosure, each isolation assembly may include a plurality of isolation units; and the plurality of isolation units are arranged along an optical path direction in the laser chip. The specific number of isolation units is not limited in the embodiment of the disclosure, and may be set by those skilled in the art according to actual situations.

In practical application, the number of isolation units included in each isolation assembly may range from 1 to 10. An intra-group interval spacing of the electrical isolation group in each isolation unit ranges from 30 μm to 100 μm; a width of the optical isolation electrode in the isolation unit may range from w*10% to w*70%, where w is the inter-group interval spacing of the electrical isolation group corresponding to the optical isolation electrode.

Figure 8:
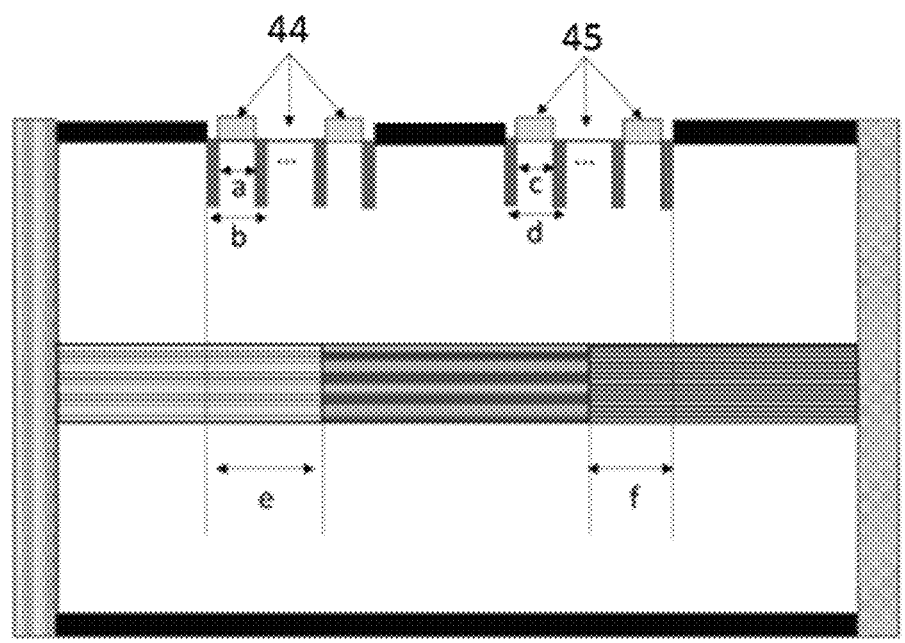
FIG. 8 is an illustration diagram of a parameter definition of an optical isolation electrode provided in the embodiment of the disclosure.

Referring to FIG. 8, two isolation assemblies are disposed in the embodiment of the disclosure, where one isolation assembly is located between the laser light source and the electro-absorption modulator, and the other isolation assembly is located between the electro-absorption modulator and the semiconductor optical amplifier. The isolation assembly located between the laser light source and the electro-absorption modulator is denoted as a first isolation assembly, an optical isolation electrode included in the first isolation assembly is denoted as a first optical isolation electrode 44, and an electrical isolation group included in the first isolation assembly is denoted as a first electrical isolation group 31.

The number n of first optical isolation electrodes 44 ranges from 1 to 10, preferably 1.

An intra-group interval spacing b of the first electrical isolation group 31 ranges from 30 μm to 100 μm, preferably 50 μm.

A width a of the first optical isolation electrode 44 ranges from b*10% to b*70%, preferably b*50%.

The isolation assembly located between the electro-absorption modulator and the semiconductor optical amplifier is denoted as a second isolation assembly, an optical isolation electrode included in the second isolation assembly is denoted as a second optical isolation electrode 45, and an electrical isolation group included in the second isolation assembly is denoted as a second electrical isolation group 32.

The number m of second optical isolation electrodes 45 ranges from 1 to 10, preferably 1.

An intra-group interval spacing d of the second electrical isolation group 32 ranges from 30 μm to 100 μm, preferably 70 μm.

A width c of the second optical isolation electrode 45 ranges from d*10% to d*70%, preferably d*50%.

A voltage may be applied to one or both of the first optical isolation electrode 44 and the second optical isolation electrode 45; and the applied voltage ranges from 2 V to −2 V.

When the voltage is applied to both of the first optical isolation electrode and the second optical isolation electrode, a magnitude of the applied voltage may be set as required, and both the first optical isolation electrode 44 and the second optical isolation electrode 45 may also be electrically connected to a substrate 10. This is not limited in the embodiment of the disclosure.

Referring to FIG. 4 to FIG. 7, the laser chip includes a substrate 10, and a functional layer, an upper cladding layer 30 and an electrode layer, which are stacked on the substrate 10 in sequence; the laser light source includes a light source region 21 located in the functional layer and a light source electrode 41 located in the electrode layer; the electro-absorption modulator includes a modulator region 22 located in the functional layer and a modulator electrode 42 located in the electrode layer; and the semiconductor optical amplifier includes an optical amplifier region 23 located in the functional layer and an optical amplifier electrode 43 located in the electrode layer.

The electrical isolation group of the isolation unit is located in the upper cladding layer 30; and the optical isolation electrode is located in the electrode layer. Specifically, both the first electrical isolation group 31 and the second electrical isolation group 32 are located in the upper cladding layer 30; and the first optical isolation electrode 44 is located between the light source electrode 41 and the modulator electrode 42 in the electrode layer, and the second optical isolation electrode 45 is located between the modulator electrode 42 and the optical amplifier electrode 43 in the electrode layer. The upper cladding layer 30 is further provided with an insulating layer; and the insulating layer is disposed in a region, that is not covered by the electrode layer, of the upper cladding layer 30.

Referring to FIG. 8, a vertical distance (an interface distance for short) e from the strip-shaped insulating component on a leftmost side in a light-emitting direction to an interface between the light source region 21 and the modulator region 22 ranges from 0 to n*b, preferably n*b, where n is the number of optical isolation electrodes disposed between the laser light source and the electro-absorption modulator, that is, the number of first optical isolation electrodes 44; and b is the intra-group interval spacing of the electrical isolation group disposed between the laser light source and the electro-absorption modulator, that is, the intra-group interval spacing of the first electrical isolation group 31.

A vertical distance (an interface distance for short) f from the strip-shaped insulating component on a rightmost side in a light-emitting direction to an interface between the modulator region 22 and the optical amplifier region 23 ranges from 0 to m*d, where m is the number of optical isolation electrodes disposed between the electro-absorption modulator and the semiconductor optical amplifier, that is, the number of second optical isolation electrodes 45; and d is the intra-group interval spacing of the electrical isolation group disposed between the electro-absorption modulator and the semiconductor optical amplifier, that is, the intra-group interval spacing of the second electrical isolation group 32.

Further, after wafer dissociation, an anti-reflective coating layer 51 may be disposed on a light-emitting end surface of the semiconductor optical amplifier, and a highly reflective coating layer 52 may be disposed on an end surface of one side, that is away from the electro-absorption modulator, of the laser light source.

Figure 4:
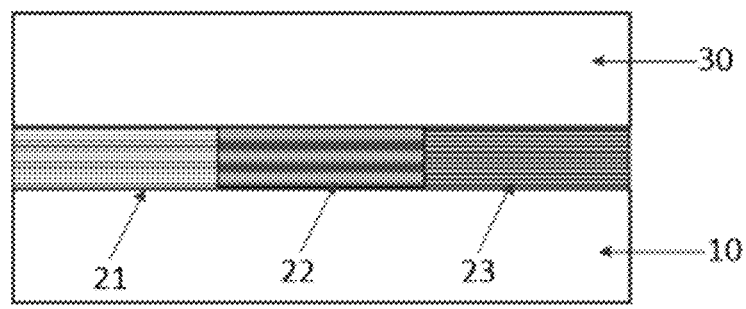
FIG. 4 is a structural diagram of a crystal growth process provided in the embodiment of the disclosure.

Another embodiment of the disclosure provides a fabrication method of any one of the above electro-absorption modulated laser chips, including:

S1: epitaxially growing a functional layer on a substrate 10, where the functional layer includes a light source region 21, a modulator region 22, and an optical amplifier region 23. Referring to FIG. 4, the three regions may be made of a same material or different materials.

S2: growing an upper cladding layer 30 on the functional layer.

The upper cladding layer 30 may be grown on the basis of S1 by means of a crystal regrowth technology.

S3: fabricating at least one electrical isolation group on the upper cladding layer 30.

Figure 5:
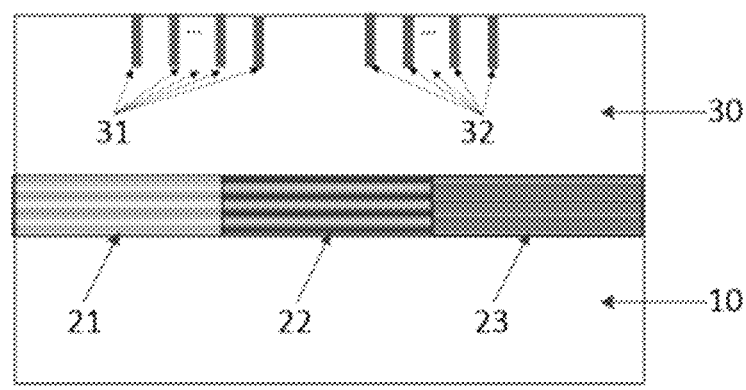
FIG. 5 is a structural diagram of a fabrication process for an electrical isolation region provided in the embodiment of the disclosure.

Referring to FIG. 5, after the upper cladding layer 30 is fabricated, a plurality of first electrical isolation groups 31 and a plurality of second electrical isolation groups 32 may be formed on the upper cladding layer 30 by means of a general etching technology or ion implantation technology.

S4: forming an electrode layer on the upper cladding layer 30, and forming an N-surface electrode 61 on one side, that is away from the functional layer, of the substrate 10, where the electrode layer includes a light source electrode 41, a modulator electrode 42, an optical amplifier electrode 43, and an optical isolation electrode.

Further, before S4, an insulating layer may also be grown on the upper cladding layer 30, and an insulating layer of a preset region on the upper cladding layer 30 is removed.

Correspondingly, in S4, the electrode layer is formed on the preset region of the upper cladding layer 30, and the N-surface electrode 61 is formed on one side, that is away from the functional layer, of the substrate 10.

An insulating layer is grown on the surface of the upper cladding layer 30 that is provided with the electrical isolation group, and then the insulating layer on an upper surface of the preset region (a waveguide) is removed by means of the general etching technology.

Figure 6:
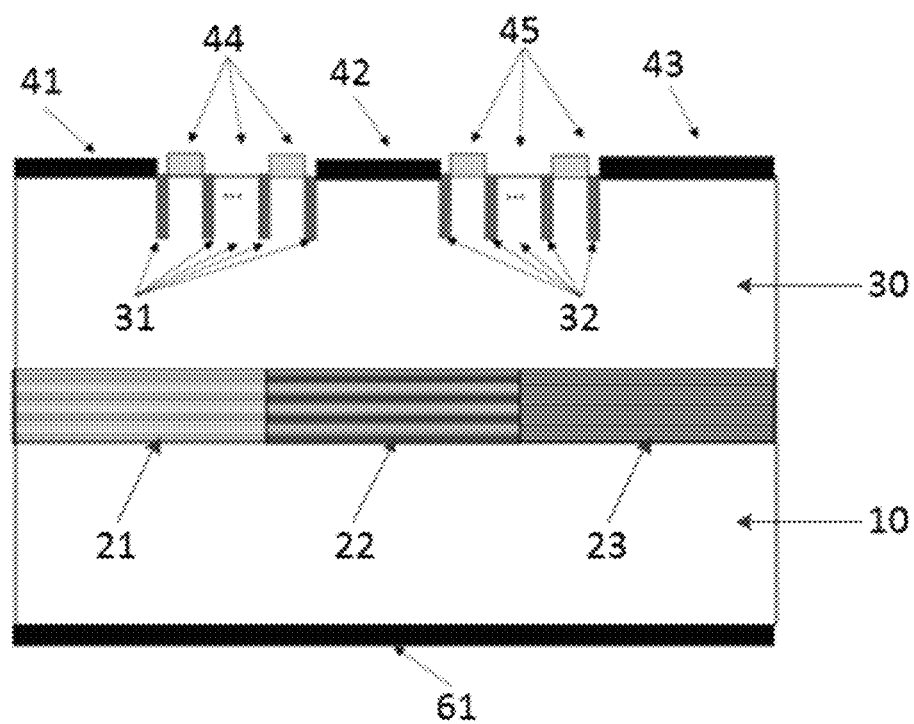
FIG. 6 is a structural diagram of a metal electrode growth process provided in the embodiment of the disclosure.

Referring to FIG. 6, in practical application, the light source electrode 41, the modulator electrode 42, the optical amplifier electrode 43, the optical isolation electrode, and the N-surface electrode 61 may be formed by means of a metallization process.

Figure 7:
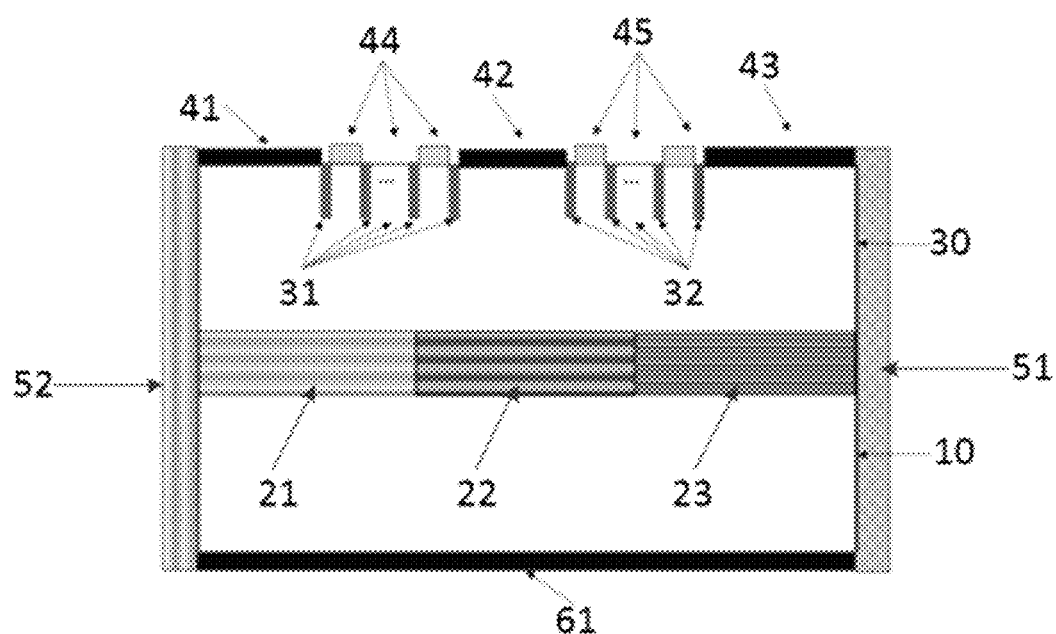
FIG. 7 is a structural diagram of an end surface coating process provided in the embodiment of the disclosure.

Further, referring to FIG. 7, after the electrode layer is fabricated, a highly reflective coating layer 52 and an anti-reflective coating layer 51 may further be fabricated on two end surfaces, respectively, after wafer dissociation.

Several specific structures of the laser chip are provided below.

Embodiment 1

Figure 9:
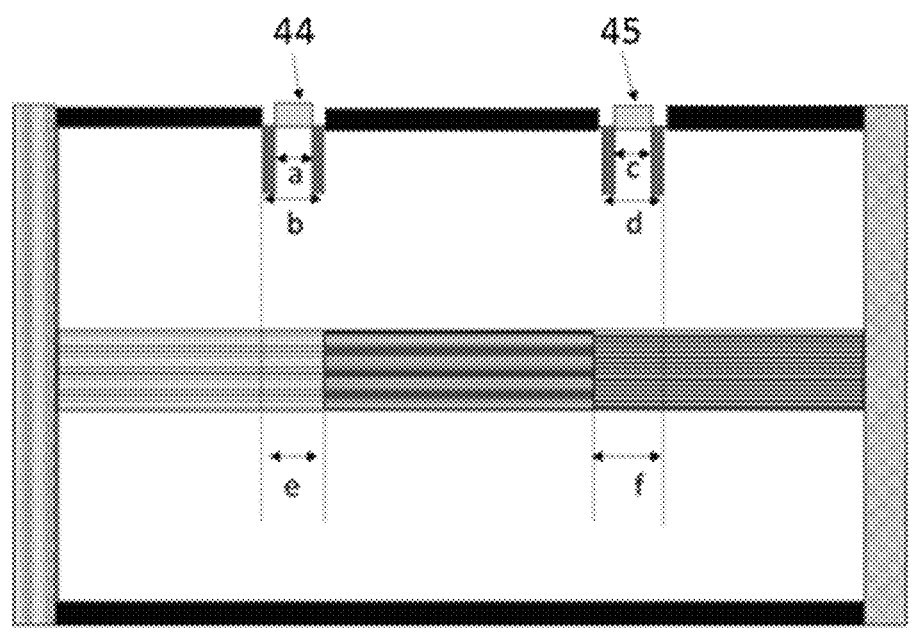
FIG. 9 is a schematic structural diagram of Embodiment 1 provided in the embodiment of the disclosure.

As shown in FIG. 9, the number of first optical isolation electrodes 44 is equal to the number of second optical isolation electrodes 45, that is, m=n=1; a spacing b of first electrical isolation groups 31 is equal to 50 μm, and a width a of the first optical isolation electrodes 44 is equal to 30 μm; a spacing d of second electrical isolation groups 32 is equal to 50 μm, and a width c of the second optical isolation electrodes 45 is equal to 30 μm; an interface distance e is equal to 50 μm; an interface distance f is equal to 50 μm; and a voltage of 0 V and a voltage of −1 V are applied to the first optical isolation electrodes 44 and the second optical isolation electrodes 45, respectively. It may be seen from experimental analysis that compared to a structure without optical isolation electrodes, this design is improved in both quality of a high-frequency modulated optical signal and fiber transmission distance.

Embodiment 2

Figure 10:
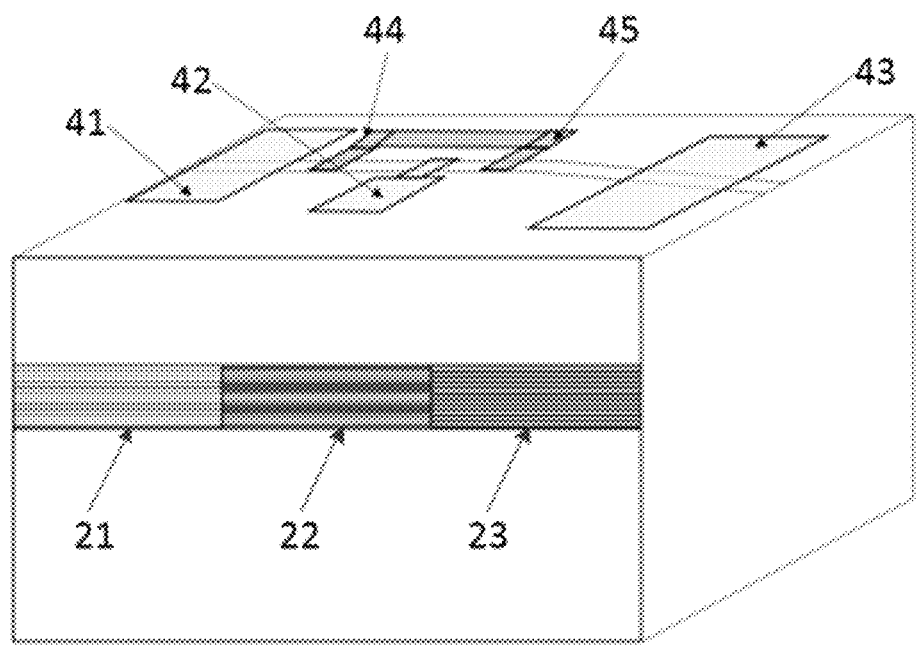
FIG. 10 is a schematic structural diagram of Embodiment 2 provided in the embodiment of the disclosure.

In an actual implementation process, first optical isolation electrodes 44 may be connected to second optical isolation electrodes 45, so that driving circuits for applying voltages to the optical isolation electrodes during use of a chip may be reduced, and the complexity of optical chip driving circuits is lowered. As shown in FIG. 10, the number of first optical isolation electrodes 44 is equal to the number of second optical isolation electrodes 45, that is, m=n=1; a spacing b of first electrical isolation groups 31 is equal to 50 μm, and a width a of the first optical isolation electrodes 44 is equal to 30 μm; a spacing d of second electrical isolation groups 32 is equal to 50 μm, and a width c of the second optical isolation electrodes 45 is equal to 30 μm; an interface distance e is equal to 50 μm; an interface distance f is equal to 70 μm; and the first optical isolation electrodes 44 and the second optical isolation electrodes 45 are connected to each other, and a voltage of −1 V is applied to both the first optical isolation electrodes and the second optical isolation electrodes, so that the problem of signal distortion can also be reduced.

Embodiment 3

Figure 11:
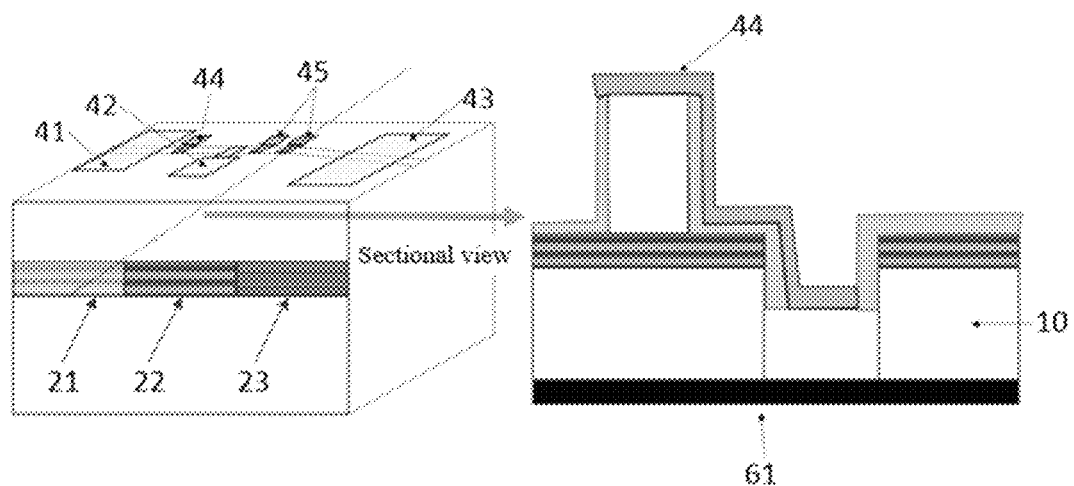
FIG. 11 is a schematic structural diagram of Embodiment 3 provided in the embodiment of the disclosure.

If optical isolation electrode driving channels in optical chip driving circuits need to be removed, first optical isolation electrodes 44 and second optical isolation electrodes 45 may be directly connected to a substrate 10 of a laser chip in the chip, to achieve the objective of self-bias. As shown in FIG. 11, the number n of first optical isolation electrodes 44 is equal to 1, and the number m of second optical isolation electrodes 45 is equal to 2; a spacing b of first electrical isolation groups 31 is equal to 70 μm, and a width a of the first optical isolation electrodes 44 is equal to 40 μm; a spacing d of second electrical isolation groups 32 is equal to 70 μm, and a width c of the second optical isolation electrodes 45 is equal to 40 μm; an interface distance e is equal to 0 μm; an interface distance f is equal to 0 μm; and the first optical isolation electrodes 44 and the second optical isolation electrodes 45 are self-biased without additional optical isolation driving circuits, so that the problem of signal distortion can also be reduced.

According to the electro-absorption modulated laser chip provided by the disclosure, the plurality of isolation assemblies are fabricated in a distributed manner between the laser light source and the electro-absorption modulator (EAM) and between the EAM and the semiconductor optical amplifier (SOA), and during use of the chip, different voltages are applied to the optical isolation electrodes of the isolation assemblies, respectively, to adjust the optical isolation capability of an optical isolation electrode region, so as to implement optical isolation among the SOA, the EAM, and the laser light source, achieve the objective of controlling signal distortion of the electro-absorption modulated laser (EML) integrated with the SOA, and implement longer-distance transmission of a signal; and on this basis, the refractive index change of the region may also be controlled by adjusting the voltage of the optical isolation electrodes, to implement chirp compensation of the laser modulation signal, and achieve the objective of increasing the transmission distance of the laser. The technology of the disclosure is more liable to implement mass production and manufacturing of high-power EMLs, and provides a feasible solution for further expansion of a passive optical network (PON) access network.

The above are merely several embodiments of the disclosure, and do not limit the disclosure in any form. Although the disclosure is disclosed as above by the preferred embodiments, it is not intended to limit the disclosure. Some variations or modifications made by any of those skilled in the art using the above disclosed technical content without departing from the scope of the technical solution of the disclosure are all equivalent to equivalent embodiments, and all fall within the scope of the technical solution.

What is claimed is:

1. An electro-absorption modulated laser chip, comprising:
a laser light source;
an electro-absorption modulator, disposed on a light-emitting side of the laser light source;
a semiconductor optical amplifier, disposed on a light-emitting side of the electro-absorption modulator; and
at least one isolation assembly, disposed between the laser light source and the electro-absorption modulator, and/or, disposed between the electro-absorption modulator and the semiconductor optical amplifier, and configured to isolate optical crosstalk among the laser light source, the electro-absorption modulator, and the semiconductor optical amplifier;
wherein the electro-absorption modulated laser chip comprises a substrate, and a functional layer, an upper cladding layer and an electrode layer, which are stacked on the substrate in sequence;
each of the at least one isolation assembly comprises at least one isolation unit;
each of the at least one isolation unit comprises an optical isolation electrode and a corresponding electrical isolation group, and the corresponding electrical isolation group comprises two strip-shaped insulating components disposed oppositely; and
the optical isolation electrode is located above an intra-group region of the corresponding electrical isolation group;
the corresponding electrical isolation group of the at least one isolation unit is located in the upper cladding layer; and the optical isolation electrode is located in the electrode layer,
an intra-group interval spacing of the corresponding electrical isolation group in each of the at least one isolation unit ranges from 30 μm to 100 μm.

2. The electro-absorption modulated laser chip according to claim 1, wherein each of the at least one isolation assembly comprises a plurality of isolation units; and
the plurality of isolation units are arranged along an optical path direction in the electro-absorption modulated laser chip.

3. The electro-absorption modulated laser chip according to claim 1, wherein
a number of the at least one isolation unit comprised in each of the at least one isolation assembly ranges from 1 to 10.

4. The electro-absorption modulated laser chip according to claim 1, wherein
a width of the optical isolation electrode in the at least one isolation unit ranges from w*10% to w*70%, wherein w is an inter-group interval spacing of the corresponding electrical isolation group corresponding to the optical isolation electrode.

5. The electro-absorption modulated laser chip according to claim 1, wherein
a voltage of the optical isolation electrode in the at least one isolation unit ranges from 2 V to −2 V.

6. The electro-absorption modulated laser chip according to claim 1, the laser light source comprises a light source region located in the functional layer and a light source electrode located in the electrode layer;
the electro-absorption modulator comprises a modulator region located in the functional layer and a modulator electrode located in the electrode layer;
the semiconductor optical amplifier comprises an optical amplifier region located in the functional layer and an optical amplifier electrode located in the electrode layer.

7. The electro-absorption modulated laser chip according to claim 6, wherein
a vertical distance from the strip-shaped insulating component on a leftmost side in a light-emitting direction to an interface between the light source region and the modulator region ranges from 0 to n*b, wherein n is the number of optical isolation electrodes disposed between the laser light source and the electro-absorption modulator, and b is an intra-group interval spacing of the corresponding electrical isolation group disposed between the laser light source and the electro-absorption modulator, and
a vertical distance from the strip-shaped insulating component on a rightmost side in a light-emitting direction to an interface between the modulator region and the optical amplifier region ranges from 0 to m*d, wherein m is the number of optical isolation electrodes disposed between the electro-absorption modulator and the semiconductor optical amplifier, and d is an intra-group interval spacing of the corresponding electrical isolation group disposed between the electro-absorption modulator and the semiconductor optical amplifier.

8. The electro-absorption modulated laser chip according to claim 6, wherein the optical isolation electrodes comprised in all the at least one isolation assembly are electrically connected to the substrate.

9. The electro-absorption modulated laser chip according to claim 6, wherein the upper cladding layer is further provided with an insulating layer; and the insulating layer is disposed in a region, that is not covered by the electrode layer, of the upper cladding layer.

10. A fabrication method of the electro-absorption modulated laser chip according to claim 6, comprising:
epitaxially growing a functional layer on a substrate;
growing an upper cladding layer on the functional layer;
fabricating at least one electrical isolation group on the upper cladding layer; and
forming an electrode layer on the upper cladding layer, and forming an N-surface electrode on one side, that is away from the functional layer, of the substrate.

11. The fabrication method according to claim 10, wherein the electrical isolation group is fabricated on the upper cladding layer by means of an etching technology or an ion implantation technology.

12. The electro-absorption modulated laser chip according to claim 1, wherein the optical isolation electrodes comprised in all the at least one isolation assembly are electrically connected to one another.

13. The electro-absorption modulated laser chip according to claim 1, wherein the electro-absorption modulated laser chip further comprises an anti-reflective coating layer, which is located on a light-emitting end surface of the semiconductor optical amplifier, and a highly reflective coating layer, which is located on an end surface of one side, that is away from the electro-absorption modulator, of the laser light source.

* * * * *